United States Patent [19]

Lillington et al.

[11] Patent Number: 4,694,115
[45] Date of Patent: Sep. 15, 1987

[54] SOLAR CELL HAVING IMPROVED FRONT SURFACE METALLIZATION

[75] Inventors: David R. Lillington, Van Nuys; Nick Mardesich, Simi Valley; Hans G. Dill, Newhall; George F. J. Garlick, Los Angeles, all of Calif.

[73] Assignee: Spectrolab, Inc., Sylmar, Calif.

[21] Appl. No.: 927,282

[22] Filed: Nov. 4, 1986

[51] Int. Cl.$^4$ .............................................. H01L 31/06
[52] U.S. Cl. ................................... 136/256; 136/262; 357/68
[58] Field of Search .................. 136/256, 262; 357/68

[56] References Cited

U.S. PATENT DOCUMENTS

| | | | |
|---|---|---|---|
| 3,982,964 | 9/1976 | Lindmayer et al. | 136/256 |
| 4,122,476 | 10/1978 | Hovel et al. | 357/16 |
| 4,126,930 | 11/1978 | Moon | 29/572 |
| 4,395,583 | 7/1983 | Meulenberg, Jr. et al. | 136/256 |
| 4,401,840 | 8/1983 | Chitre | 136/258 PC |
| 4,564,720 | 1/1986 | Hogan | 136/256 |
| 4,589,191 | 5/1986 | Green et al. | 29/572 |

FOREIGN PATENT DOCUMENTS 60-157269  8/1985  Japan ................................ 136/262

Primary Examiner—Aaron Weisstuch
Attorney, Agent, or Firm—Terje Gudmestad; Paul M. Coble; A. W. Karambelas

[57] ABSTRACT

A gallium arsenide solar cell is disclosed having an aluminum gallium arsenide window layer in which fine metallic contact lines extend through the aluminum gallium arsenide window to electrically contact the emitter layer, and a plurality of metallic grid lines disposed on the window layer cross the contact lines, thereby making electrical contact to the metallic contact lines. A flat metallic strip extending along one of the edges of the solar cell electrically couples the grid lines to one another. Consequently, two separate metals can be used, one with good ohmic contact properties for the grid lines and another with good adhesion and current conducting properties for the current collecting bars. Additionally, the metallic contacts lines can be made very narrow to reduce the contact area to the emitter thereby reducing the recombination current in the emitter.

7 Claims, 12 Drawing Figures

SOLAR CELL HAVING IMPROVED FRONT SURFACE METALLIZATION

BACKGROUND OF THE INVENTION

1. Field of the Invention

The present invention relates in general to solar cells, and more particularly, to solar cells having improved front surface metallization.

2. Description of Related Art

Conventional solar cells consist of a semiconductor body having a P-type conductivity layer, an N-type conductivity layer, and N-P or P-N semiconductor junction between these layers, a front light-receiving major surface, and a back major surface, The layer adjacent the front surface is called the emitter, and the layer adjacent the back surface is called the base. When light energy impinges on the front light-receiving surface of the cell, electrons and corresponding holes are created in both the emitter and base. For the most part, because of the presence of the semiconductor junction, electrons will be directed toward on major surface of the cell and holes toward the other major surface, resulting in a photocurrent density. In a typeical P-N gallium arsenide semiconductor junction solar cell, holes move to the front light receiving surface of the cell and electrons toward the back surface. Electrical contacts are attached to the front and back surfaces of the gallium arsenide semiconductor body to collect the charge carriers. the electrons are collected by the back electrical contact and holes by the front electrical contact. the object is to collect as many electrons and holes as possible before they recombine, to attain the highest photo-current density possible.

A portion of the carriers directed toward the front surface, however, recombine under the front contact and thus do not contribute to the photo-current density. This is known in the art as the front surface recombination velocity. The front electrical contact of a gallium arsenide solar cell is one area where cell improvement has been sought by industry.

SUMMARY OF THE INVENTION

It is, therefore, an object of this invention to provide a solar cell in which front surface emitter recombination current is minimized.

It is a further object of this invention to provide a solar cell with improved open circuit voltage and efficiency.

It is still a further object of the invention to provide a solar cell which can be reproducibly manufactured with high yield.

In accordance with the foregoing objects, a solar cell according to the present invention includes a semiconductor body having at least two adjacent impurity doped semiconductor layer of opposite conductivity type forming the base and emmitter layers of the solar cell respectiely, with a semiconductor junction therebetween. The base and emmitter layers have back and front major essentially parallel surfaces, respectively. A layer of aluminum gallium arsenide is disposed over the emitter layer front major surface and has an exposed major surface. The aluminum gallium arsenide layer has a plurality of transverse groove therein that extend vertically through this layer to the emitter layer front major surface. The grooves contain metal contact lines that electrically contact the emitter layer for charge carrier collection. a plurality of current collectiong metails grid lines located on the exposed front major surface cross the metallic contact lines making electrical contact to these contact lines. A flat metal strip also located on the aluminum gallium arsenide exposed major surface electrially couples the current collecting metallic grid lines to one another and provides a region for welding interconnection to other solar cells.

Other and further objects, advantages, and characteristic features of the present invention will become apparent from the fling detail description of preferred embodiment of the invention when taken in conjuction with the appended drawings.

BRIEF DESCRIPTION OF THE DRAWIGS

FIG. 2 is a perspective view partly in section of a portion of the solar cell shown in FIG. 1a;

FIGS. 5(a)–(g) are respective cross-sectional views of fabricating a solar cell according to the invention.

DESCRIPTION OF THE PREFERRED EMBODIMENTS

Figure 1A:
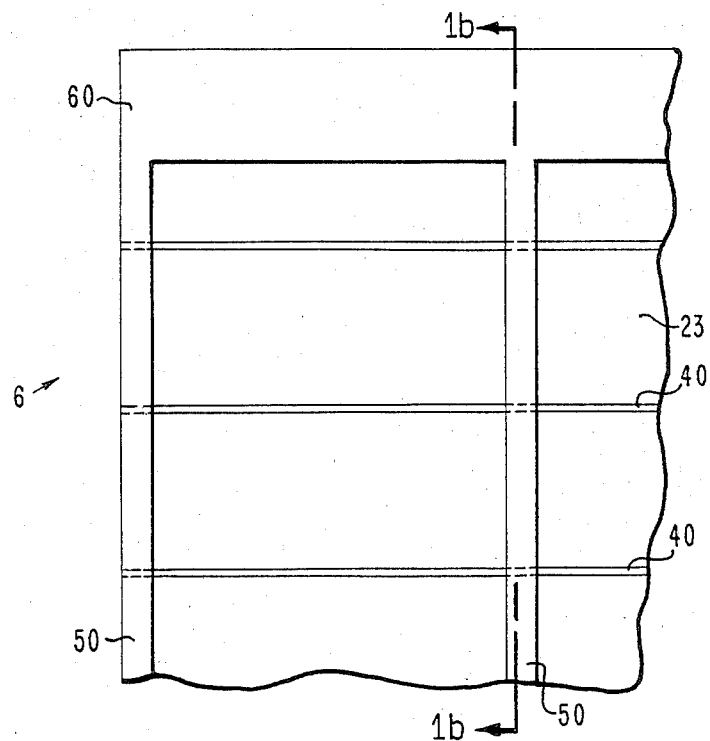
FIG. 1(a) is a plain view of a portion of a solar cell according to the principles of of the invention.
Figure 1B:
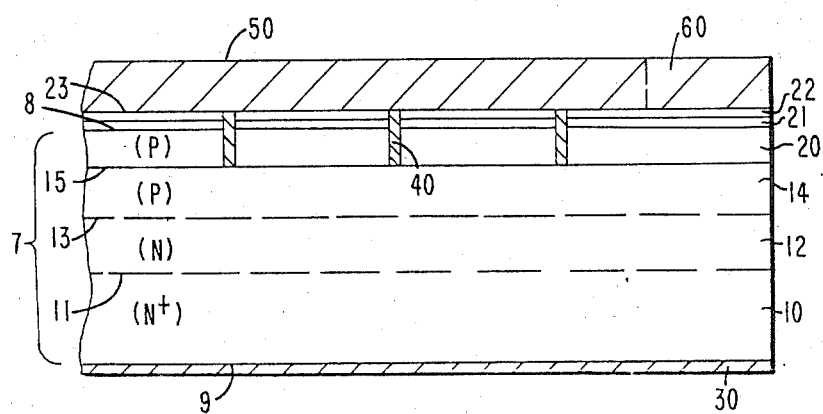
FIG. 1(b) is a cross-sectional view taken along line b—b of FIG. 1(a)
Figure 2:
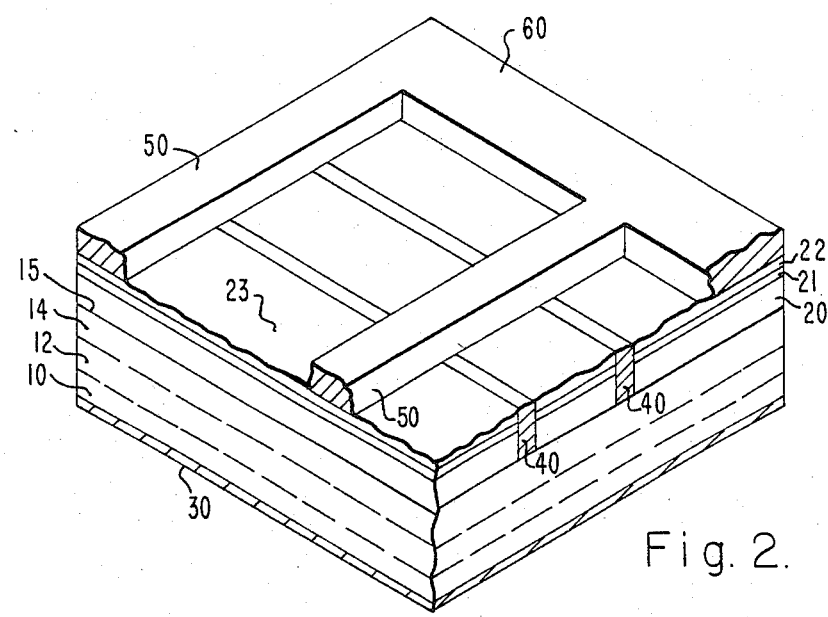

Referring now, with greater particularity, to FIGS. 1a, 1b, and 2, a solar cell 6 is shown having a semiconductor body 7 with front and back major parallel surfaces 8 and 9. The semiconductor body includes a substrate layer 10 which may be gallium arsenide, although germanium or silicon may be used instead. The substrate layer 10 may be impurity doped to an N+ conductivity, for example. A base layer 12 overlies substrate 10 and is typically gallium arsenide which may be impurity doped to an N type conductivity, for example. If the substrate layer 10 is made of silicon semiconductor material, a layer of germanium is disposed between the substrate 10 and the gallium arsenide base 12 to lattice match the silicon semiconductor material. An emitter layer 14 of gallium arsenide semiconductor material overlies the base layer 12 and may be of a P-type conductivity. An N-P junction 13 lies between the emitter layer 14 and the base layer 12. Overlying the emitter layer 14 is an aluminum gallium arsenide window layer 20 which is of the same conductivity type as the emitter layer 14, i.e., P-type conductivity.

Although an N-P semiconductor body is illustrated in FIG. 1b, a P-N semiconductor body may also be used where the substrate 10 if of P+ conductivity, the buffer layer 12 is of P cnductivity, the emitter layer 14 is of N conductivity, and the window layer 20 is of N conductivity.

Two antireflection coatings 21 and 22 overlie the front major surface 8 of the aluminum gallium arsenide window layer 20. The top antireflection coating 22 has an exposed major surface 23, and may be aluminum oxide, and the bottom antireflection coating 21 may be titanium dioxide, for example. While two layers ae typically used, fewer or more layers may be used. If a single layer is employed, it may be either silicon monoxide or tantalum oxide, for example.

A back contact 30 is located on the back major surface 9 of the semiconductor body 7. The back contact may cover the entire back surface of the solar cell or may be gidded.

Figure 3:
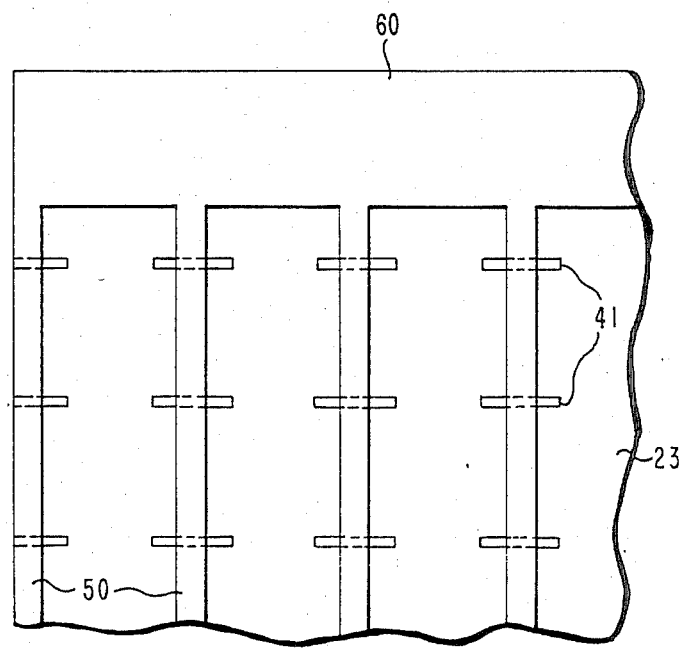
FIG. 3 is a plan view of a portion of a solar cell in accordance with another embodiment of the invention.

A plurality of essentially parallel metallic contact lines 40 travese the extend of the exposed major surface 23 of the cell. The metallic contact lines 40 typically have a rectangular cross-section and extend through the two anti-reflectin coatings 21 and 22, and the aluminum gallium arsenide layer 20, to make contact to front major surface 15 of the emitter layer 14. The metallic contact lines 40 ma be about 5 to 10 microns wide, for example. Narrower contact lines provide less contact area to the emitter layers thereby lowering the emitter recombination current under the contacts by reducing the amount of emitter material exposed to a high recombination velocity region. Alternatively instead of the contact lines 40 of FIG. 1, a plurality of metal rectangular contact segments 41 arranged in rows and columns, may be provided, as shown in FIG. 3, which further reduce the contact area to the emitter. Adjacent metal contact lines 40 or segments 41 may be spaced about 800 microns apart.

Current collecting metallic grid lines 50 disposed on the expose a major surface 23 of te top anti-refletion coating 22 longitudinally traverse the extent of the cell 6 generally perpendicular to the metallic contact lines 40. The metallic rid lie 50 cross and make electrical contact with te metallic contact lines 40. the width of the grid lines 50 may be about 25 to 60 microns, for example, but 30 to 40 microns provides good results. Adjacent grid lines may be spaced apart by a distance of one to two millimeters, (one-half to one millimeters for FIG. 3) for example. The optimal spacing between adjacent grid lines 50, however, varies with the width selected for the metal contact lines 40, and the width and high of grid lines 50.

Figure 4:
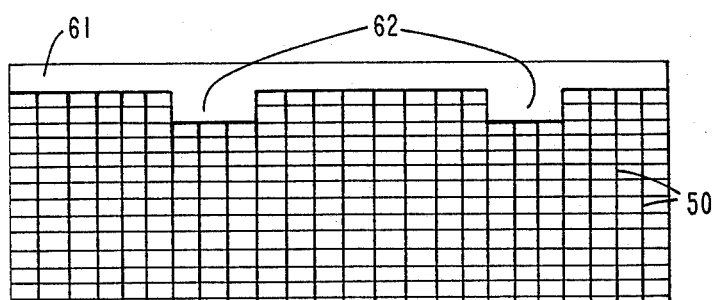
FIG. 4 is a plan view of a solar cell in accordance with the invention.

A flat metal strip 60 traversingly extends across the cell and is located on the exposed major surface 23 of the top anti-reflection coating 22 near an edge of the cell 6. The strip 60 is essentially parallel to the metallic contact lines 40 and substantially perpendicualr to the current collecting metallic grid lines 50, being intersected by and in electrical contact with grid lines 50. The flat metallic strip 60 may have a rectangular surface area, or as shown in FIG. 4 may instead be in the form of a very narrow metallic strip 61 with one or more extended metallic regions 62 along the lenght of the strip 61. The extended regions 62 have sufficient surface area to weld to electrical interconnections from other cells.

A solar cell 6 is described above in which the contact resistance to the solar cell and the adhesion of the front electrical contacts to the solar cell can be individually optimized, and the contact area of the front surface metalization minimized. A metal alloy can be selected for the metal contact lines 40 that provides good electrical contact to the emitter layer 14, thereby lowering contact resistance and increasing efficiency. A different metal alloy can be selected for the current collecting metallic grid lines 50 and the flat metallic strip 60 that provides good adhesion to the cells' exposed major face 23, thereby maximizing the mechanical integrity of the flat metallic strip 60 and the grid lines 50. Additionally, the metallic contact lines 40 can be made very narrow, i.e., in the range of 5 to 10 microns compared to 50 to 60 microns for typical prior art cells. Consequently, the contact area of the metallic contact lines 40 to the emitter layer 14 of the cell may be greatly reduced thereby lowering the recombination current at the emitter front major surface, and thereby increasing voltage and efficiency. Moreover, solar cells embodying the invention may be fabricated by relatively low cost, high yield processes.

Figure 5:
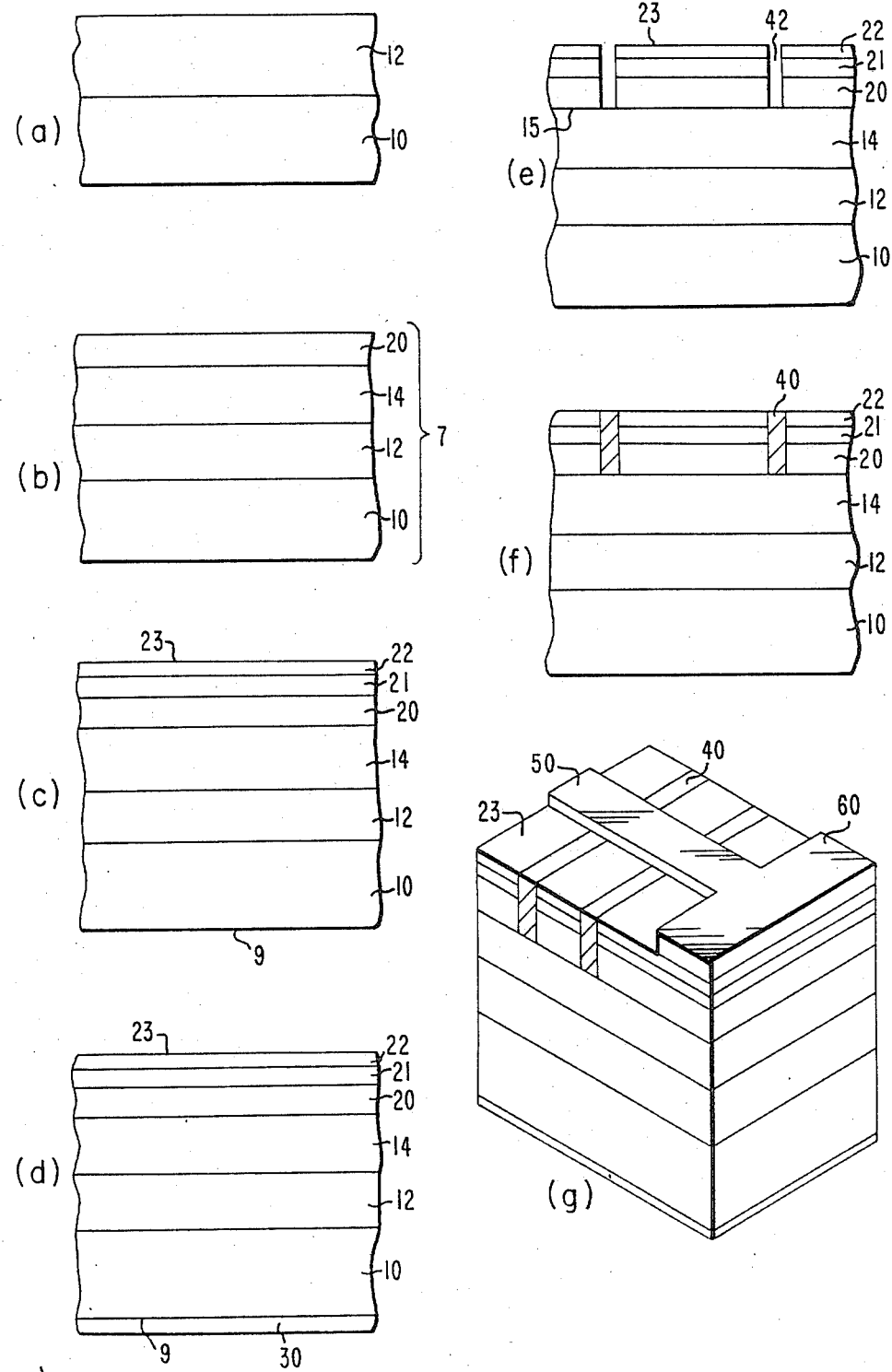

The fabrication of the semiconductor body 7 has been described in several publications in the past such as G. S. Kamath, Advanced Solar Cells for Space Applications, Proceedings of 21st IECEC 1425-26 (August 1986) which is incorporated herein by reference. Briefly, however, as shown in FIG. 5a, a layer of N-type conductivity gallium arsenide 12, the base, is grown on top of a N+ gallium arsenide substrate 10 using any one of many well known techniques, one of which is liquid phase epitaxy. The N-type base layer 12 typically has a concentration of about $2 \times 10^{17}$ impurity atoms per cubic centimeter and a thickness of about 10 mocrons, while the N+ substrate layer 10 typically has a concentration of about $2 \times 10^{18}$ impurity atoms per cubic centimeter and a thickness of 250 microns.

In the nest processing step shown in FIG. 5b, an aluminum gallium arsenide layer 20 is grown on top of the N layer 12 by liquid phase epitaxy, metal organic chemical vapor deposition, molecular beam epitaxy, for example. The aluminum gallium arsenide is doped with a P-type dopant which may be beryllium of a typical concentration of $2 \times 10^{18}$ atoms per cubic centimeter, for example. Upon deposition of the aluminum gallium arsenide layer 20, beryllium atoms from this layer diffuse into the N layer 12 thereby doping a thin emitter layer 14 adjacent the aluminum gallium arsenide layer 20 to P-type conductivity. The aluminum gallium arsenide layer 20 typically contains about $2 \times 10^{18}$ impurity atoms and is grown to a thickness of about 0.03 –0.4 microns.

After the semiconductor body 7 has been fabricated, two anti-reflection coatings 21 and 22 typically of aluminum oxide and titanium oxide, respectively, may be deposited on the aluminum gallium arsenide layer 20, by any technique known in the art, as shown in FIG. 5c. However, additional or fewer layers of antireflection coatings may be employed. Reference may be made to F. Bunshah et al, Deposition Technology for Films and Coatings (Noyes Publ. 1982) which is incorporated herein by refference.

Thereafter, as shown in FIG. 5d, the back surface metallization 30 is applied. A metal alloy, such as gold, germanium, and nickel, for example, is electron beam evaporated or otherwise deposited over the back major surface 9, and thereafter sintered to form good ohmic contact to the semiconductor body 7. The back surface metallization may precede the deposition of the anti-reflection coatings without affecting the properties of the cell.

In the next steps, the metal contact lines 40 are fabricated onto the solar cell semiconductor body. The exposed major surface 23 of layer 22 is provided with a patterned layer of photoresist (not shown), and the exposed portions are etched vertically through the two antireflection coatings 21 and 22 and the aluminum gallium arsenide window layer 20 and 22 and the aluminum gallium arsenide window layer 20 to the emitter layer 14 front major surface 15, forming fine grooves 42, as shown in FIG. 5e. Thereafter a metal alloy, such as gold and zinc, for example, is sputtered over the photoresist and int the fine groves 42, and then silver is evaporated thereon using electron vaccum deposition. Alternatively, the metallic contact lines 40 may be deposited on the exposed major surface 23 using ion plating, evaporation from a resistive source, or electroplating. The remaining photoresist is thereafter lifted off along with the metal on the photoresist using organic solvents leaving behind the fine metallic contact lies 40, as shown in FIG. 5f.

After the metallic contact lines 40 have been deposited, the metallic grid lines 50 and the flat metallic strip 60 are fabricated onto the cell, as shown by FIG. 5g. Using mechanical foil mask processing, a foil mask, with openings for the grid lines and flat strip is placed on the exposed major surface 23 of the top anti-reflection coating 22, and metal is evaporated onto the surface. The metal is thereafter sintered to provide good adhesion to the top anti-reflection coated exposed major surface 23. A metal alloy such as titanium, gold, zinc, and silver may be used, for example, which provides good adhesion.

It will be appreciated that while the embodiment of the solar cell structure illustrated herein employs an P-N semiconductor body 7, the principles of the invention are also applicable to N-P type cells.

Thus, although the present invention has been shown and described with the reference to particular embodiments, nevertheless various changes and modifications obvious to one skilled in the art are deemed to be within the spirit, scope,and comtemplation of the invention as set forth in the appended claim.

What is claimed is:

1. A solar cell comprising:
   a first layer of gallium arsenide semiconductor material of an N+ conductivity;
   a second layer of gallium arsenide semiconductor material of an N conductivity overlying said first layer;
   a third layer of gallium arsenide semiconductor material of a P conductivity overlying said N conductivity layer and forming a P-N junction therebetween, said P conductivity thrid layer and said N+ conductivity first layer having front and back essentially parallel major surfaces, respectively, which are essentially parallel to said P-N junction;
   a layer of aluminum gallium arsenide semiconductor material of a p conductivity overlying said front major surface of said P conductivity third layer and having an exposed surface essentially parallel to said front major surface and at least one edge;
   a plurality of longitudinally disposed metallic grid lines made of a second metal alloy composition and a first predetermined distance traversing said exposed surface and extending through said aluminum gallium arsenide layer to said front major surface and making electrical contact to said third layer;
   plurality of longitudinally disposed metallic grid lines made of a second metal alloy composition and being spaced apart by a second predetermined distance located on said exposed surface of said aluminum gallium arsenide layer and which cross said metallic contact lines and make electrical contact to said metallic lines;
   a flat metallic strip disposed on said aluminum gallium arsenide layer exposed surface near said edge, said strip electrically coupling said metallic grid lines to one another; and
   a back contact located on said back major surface.

2. A solar cell as defined in claim 1 wherein said metallic gridlines are divided into a plurality of metallic rectangular contact segments arranged in rows and columns.

3. A solar cell comprising:
   a body of semiconductor material having a first layer of a first conductivity typer and a second layer of a second conductivity typer opposite to said first conductivity type disposed adjacent to said first layer, said first and second layers having back and front major essentially parallel surfaces, respectively, and a semiconductor junction therebetween essentially parallel to said front and back surfaces;
   a layer of aluminum gallium arsenide disposed on said front major surface and having an exposed front surface and a plurality of grooves therein extending therethrough to said second layer, said grooves being spaced apart by a first predetermined distance;
   a plurality of metallic conatact lines made of a first alloy composition disposed in said grooves and making electrical contact to said second layer;
   a plurality of metallic grid lines made of a second alloy composition and spaced apart by a second predetermined distance disposed on said aluminum gallium arsenide exposed front surface, said grid lines crossing said metallic contact lines and electrically contacting said metallic contact lines; and
   a flat metallic strip disposed on said aluminum gallium arsenide layer exposed front surface electrically coupling said conductive bars to one another, said flat metallic strip having surfficient surface area to weld interconnection from other solar cells.

4. A solar cell as defined in claim 3 wherein said first layer is of N conductivity type, said second layer is of P conductivity type and said aluminum gallium arsenide layer is of P conductivity type.

5. A solar cell as defined in claim 3 wherein said semiconductor body is made of gallium arsenide, said first layer is of P conductivity type, said second layer is of N conductivity type, and said aluminum gallium arsenide layer is of N conductivity type.

6. A solar cell comprising:
   a semiconductor body having a first pair of opposed substantially parallel sides, a second pair of opposed substantially parallel sides substantially perpendicular to said first pair of sides, and exposed front and back essentially parallel major surfaces substantially perpendicular to said sides, and further including three layers of impurity doped semiconductor material located between and essentially parallel to said front and back major surfaces, a first one of said layers being of a first conductivity type and defining said back major surface, a second one of said layers being of a second opposite conductivity type and located adjacent said first layer and a third one of said layers being made of aluminum gallium arsenide, being of said second conductivity type, being located adjacent said second layer and defining said front exposed major surface, said third layer having a plurality of essentially parallel grooves therein traversing the extent of the front exposed major surface between said first pair of sides, said grooves extending through said third layer to said second layer and being spaced apart by a first predetermined distance;
   electrically conductive material of a first metal alloy composition deposited in said grooves and forming metallic contact lines;

a plurality of essentially parallel metallic grid lines made of a second metal alloy composition longitudinally disposed on said front exposed major surface between said second pair of sides and spaced apart by a second predetermined distance, said metallic grid lines crossing and making electrical contact with said metallic contact lines; and a flat metallic strip traversingly disposed on said front exposed major surface adjacent one of said second pair of sides and making electrical contact with said metallic grid lines.

7. A solar cell as defined in claim 1 wherein said first and second layers are made of gallium arsenide, said first layer is of N conductivity, and said second and third layers are of P conductivity.

* * * * *

UNITED STATES PATENT AND TRADEMARK OFFICE
CERTIFICATE OF CORRECTION

PATENT NO. : 4,694,115

DATED : September 15, 1987

INVENTOR(S) : David R. Lillington, et al

Page 1 of 4

It is certified that error appears in the above-identified patent and that said Letters Patent is hereby corrected as shown below:

Column 1, line 15, "," (second occurrence) should read --. --.

Column 1, line 22, "on" should read --one--;

Column 1, line 24, "typeical" should read --typical--;

Column 1, line 30, "the" should read --The--;

Column 1, line 32, "the" should read --The--;

Column 1, line 56, "layer" should read --layers--;

Column 1, line 64, "groove" should read --grooves--;

Column 2, line 1, "metails" should read --metallic--;

Column 2, line 10, "fling detail" should read --following detailed--;

Column 2, line 15, "plain" should read --plan--;

Column 2, line 25, after "views" insert --(FIG. 5(g) also being in perspective) of a preferred method--;

Column 2, line 43, after "material", insert --to the gallium arsenide semiconductor material--;

Column 2, line 63, "ae" should read --are--;

UNITED STATES PATENT AND TRADEMARK OFFICE
CERTIFICATE OF CORRECTION

PATENT NO. : 4,694,115
DATED : September 15, 1987
INVENTOR(S) : David R. Lillington, et al It is certified that error appears in the above-identified patent and that said Letters Patent is hereby corrected as shown below:

Column 3, line 3, "metiallic" should read --metallic--;

Column 3, line 4, "travese the extend" should read --traverse the extent--;

Column 3, line 10, "ma" should read --may--;

Column 3, line 15, after "Alternatively" insert a --,--;

Column 3, line 23, "expose" should read --exposed--;

Column 3, line 23 "te" should read --the--;

Column 3, line 26, "rid lie" should read --grid lines--;

Column 3, line 27, "te" should read --the--;

Column 3, line 27, "the" should read --The--;

Column 3, line 35 "high" should read --height--;

Column 3, line 46, "lenght" should read --length--;

Column 4, line 17, "mocrons" should read --microns--;

Column 4, line 20, "nest" should read --next--;

Column 4, line 65, "int" should read --into--;

UNITED STATES PATENT AND TRADEMARK OFFICE
CERTIFICATE OF CORRECTION

PATENT NO. : 4,694,115

DATED : September 15, 1987

INVENTOR(S) : David R. Lillington, et al

It is certified that error appears in the above-identified patent and that said Letters Patent is hereby corrected as shown below:

Column 5, line 4, "lies" should read --lines--;

Column 5, line 27, "claim" should read --claims--;

Column 5, line 38, "thrid" should read --third--;

Column 5, line 43, "p" should read --P--;

Column 5, line 47, delete "a plurality of longitudinally disposed metallic grid lines made of a second metal alloy composition and a first predetermined distance traversing said exposed surface and extending through said aluminum gallium arsenide layer to said front major surface and making electrical contact to said third layer;" and substitute --a plurality of metallic contact lines made of a first metal alloy composition and being spaced apart by a first predetermined distance traversing said exposed surface and extending through said aluminum gallium arsenide layer to said front major surface and making electrical contact to said third layer;--;

Column 5, line 54, before "plurality" insert --a--;

Column 6, line 5, "typer" should read --type--;

UNITED STATES PATENT AND TRADEMARK OFFICE
CERTIFICATE OF CORRECTION

PATENT NO. : 4,694,115
DATED : September 15, 1987
INVENTOR(S) : David R. Lillington, et al It is certified that error appears in the above-identified patent and that said Letters Patent is hereby corrected as shown below:

Column 6, line 6, "typer" should read --type--;

Column 6, line 18, "conatact" should read --contact--;

Column 6, line 30, "surfficient" should read --sufficient--;

Column 6, line 34, after "type" insert --and said third layer--;

Signed and Sealed this

Fifteenth Day of March, 1988

Attest:

DONALD J. QUIGG

*Attesting Officer*

*Commissioner of Patents and Trademarks*